(12) United States Patent
Lee (10) Patent No.: US 9,246,058 B2
(45) Date of Patent: Jan. 26, 2016

(54) LIGHT EMITTING DEVICE

(71) Applicant: LG INNOTEK CO., LTD., Seoul (KR)

(72) Inventor: Jeong Sik Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/397,821

(22) PCT Filed: Apr. 18, 2013

(86) PCT No.: PCT/KR2013/003321
§ 371 (c)(1),
(2) Date: Oct. 29, 2014

(87) PCT Pub. No.: WO2013/180388
PCT Pub. Date: Dec. 5, 2013

(65) Prior Publication Data
US 2015/0129832 A1    May 14, 2015

(30) Foreign Application Priority Data

May 30, 2012 (KR) .................. 10-2012-0057734

(51) Int. Cl.
*H01L 29/06* (2006.01)
*H01L 33/32* (2010.01)
*H01L 33/04* (2010.01)

(52) U.S. Cl.
CPC ............ *H01L 33/32* (2013.01); *H01L 33/04* (2013.01); *H01L 2224/48091* (2013.01)

(58) Field of Classification Search
None
See application file for complete search history.

(56) References Cited

U.S. PATENT DOCUMENTS

| | | |
|---|---|---|
| 2003/0164507 A1 | 9/2003 | Edmond et al. |
| 2005/0040414 A1 | 2/2005 | Hirayama et al. |
| 2005/0236642 A1 | 10/2005 | Sakai et al. |
| 2006/0192218 A1 | 8/2006 | Kyono et al. |
| 2008/0023689 A1 | 1/2008 | Kim et al. |
| 2015/0129832 A1* | 5/2015 | Lee .................. H01L 33/04 257/13 |

FOREIGN PATENT DOCUMENTS

| | | |
|---|---|---|
| EP | 2 390 972 A1 | 11/2011 |
| JP | 2005-101533 A | 4/2005 |
| JP | 2007-311619 A | 12/2010 |
| KR | 10-2008-0010136 A | 1/2008 |
| KR | 10-1002271 B1 | 12/2010 |

* cited by examiner

*Primary Examiner* — Jack Chen
(74) *Attorney, Agent, or Firm* — Birch, Stewart, Kolasch & Birch, LLP (57) ABSTRACT

Disclosed are a light emitting device, a method of fabricating the light emitting device, a light emitting device package, and a lighting system. The light emitting device includes a first conductive semiconductor layer, an $Al_xIn_yGa_{1-x-y}N$ layer ($0 < x \le 1$ and $0 < y \le 1$) on the first conductive semiconductor layer, an active layer on the $Al_xIn_yGa_{1-x-y}N$ layer, and a second conductive semiconductor layer on the active layer.

20 Claims, 6 Drawing Sheets

LIGHT EMITTING DEVICE

TECHNICAL FIELD

The embodiment relates to a light emitting device, a method of fabricating the light emitting device, a light emitting device package, and a lighting system.

BACKGROUND ART

The embodiment relates to a light emitting device, a light emitting device package, and a lighting system.

A light emitting device (LED) includes a p-n junction diode having a characteristic of converting electric energy into light energy. The p-n junction diode can be formed by combining group III-V elements of the periodic table. The LED can represent various colors by adjusting the compositional ratio of compound semiconductors.

When forward voltage is applied to the LED, electrons of an n layer are combined with holes of a p layer, so that energy corresponding to an energy gap between a conduction band and a valance band may be generated. This energy is realized as heat or light, and the LED emits the energy in the form of light.

A nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

According to a nitride semiconductor LED of the related art, a strain relief layer having an InGaN/GaN layer structure or an InGaN single layer structure is provided under an active layer in order to relieve strain in the active layer.

However, according to the related art, if a lattice matching effect is increased when the strain relief layer having the InGaN/GaN layer structure or the InGaN single layer structure is applied, as the lattice constant of the strain relief layer approximates that of the active layer, even the bandgap energy of the strain relief layer approximates that of the active layer, so that the strain relief layer may absorb light emitted from the active layer.

In addition, although the thickness of the strain relief layer may be increased in order to sufficiently relieve the strain within the limited range according to the related art, operating voltage Vf of the light emitting device may be increased due to the voltage loss in the strain relief layer.

DISCLOSURE OF INVENTION

Technical Problem

The embodiment provides a light emitting device capable of increasing light efficiency, a method of fabricating the light emitting device, a light emitting device package, and a lighting system.

In addition, the embodiment provides a light emitting device capable of reducing operating voltage by minimizing voltage loss in a strain relief layer, a method of fabricating the light emitting device, a light emitting device package, and a lighting system.

Solution to Problem

According to the embodiment, the light emitting device may include a first conductive semiconductor layer, an $Al_xIn_yGa_{1-x-y}N$ layer ($0<x\leq1$ and $0<y\leq1$) on the first conductive semiconductor layer, an active layer on the $Al_xIn_yGa_{1-x-y}N$ layer, and a second conductive semiconductor layer on the active layer.

Advantageous Effects of Invention

As described above, the embodiment can provide the light emitting device capable of increasing light efficiency by minimizing the absorption of the emitted light in the strain relief layer, the method of fabricating the light emitting device, the light emitting device package, and the lighting system.

In addition, the embodiment can provide a light emitting device capable of minimizing voltage loss in the strain relief layer by reducing the band discontinuity between the strain relieve layer and the active layer when the strain relief layer is provided under the active layer, so that the operating voltage can be lowered, the method of fabricating the light emitting device, the light emitting device package, and the lighting system.

BEST MODE FOR CARRYING OUT THE INVENTION

Reference will now be made in detail to the embodiments of the present disclosure, examples of which are illustrated in the accompanying drawings.

In the description of embodiments, it will be understood that when a layer (or film) is referred to as being on another layer or substrate, it can be directly on another layer or substrate, or intervening layers may also be present. Further, it will be understood that when a layer is referred to as being under another layer, it can be directly under another layer, and one or more intervening layers may also be present. In addition, it will also be understood that when a layer is referred to as being between two layers, it can be the only layer between the two layers, or one or more intervening layers may also be present.

Embodiment

Figure 1:
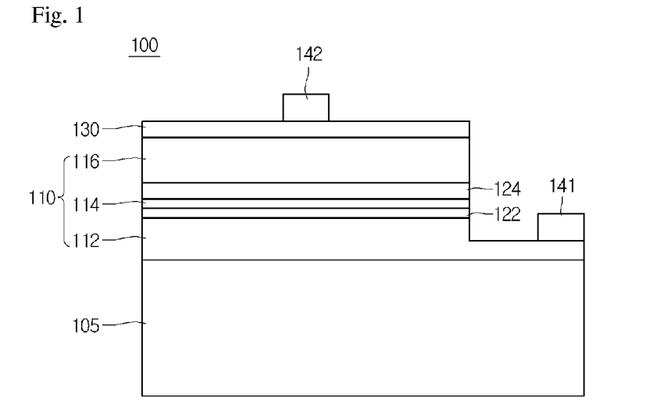
FIG. 1 is a sectional view illustrating a light emitting device according to the embodiment.

FIG. 1 is a sectional view illustrating a light emitting device 100 according to an embodiment. Hereinafter, although the embodiment is described with reference to a drawing related to a lateral type light emitting device, the embodiment is not limited thereto.

The light emitting device 100 may includes a first conductive semiconductor layer 112, an $Al_xIn_yGa_{1-x-y}N$ layer 122 ($0<x\leq1$ and $0<y\leq1$) on the first conductive semiconductor layer 112, an active layer 114 on the $Al_xIn_yGa_{1-x-y}N$ layer 122, and a second conductive semiconductor layer 116 on the active layer 114.

Figure 2:
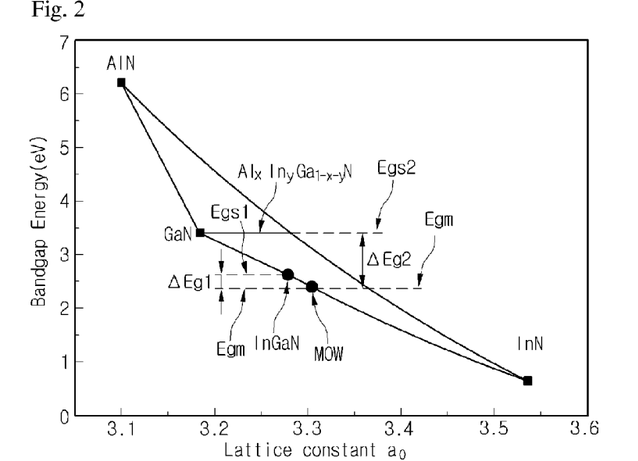
FIG. 2 is a graph illustrating bandgap energy of the light emitting device according to the embodiment as a function of a lattice constant.

FIG. 2 is a graph illustrating bandgap energy of the light emitting device according to the embodiment as a function of a lattice constant.

Figure 3:
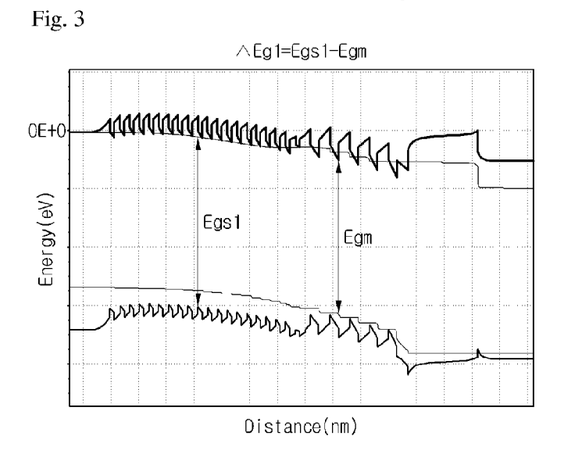
FIG. 3 illustrates a bandgap energy diagram according to the related art.
Figure 4:
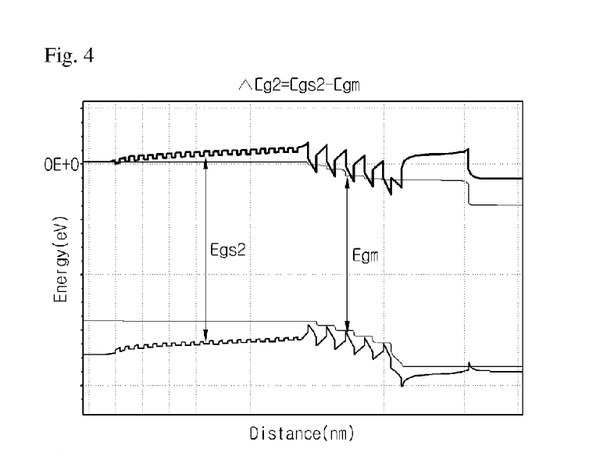
FIG. 4 is bandgap energy of the light emitting device according to the embodiment.

FIG. 3 illustrates a bandgap energy diagram according to the related art, and FIG. 4 is bandgap energy of the light emitting device according to the embodiment. In FIG. 3, an X axis represents the distance from a strain relief layer to the active layer. In FIG. 4, an X axis represents the distance from the $Al_xIn_yGa_{1-x-y}N$ layer to the active layer.

According to a nitride semiconductor LED of the related art, a strain relief layer having an InGaN/GaN single layer structure or an InGaN single layer structure is provided under an active layer in order to reduce strain in the active layer.

However, according to the related art, when the strain relief layer having the InGaN/GaN structure or the InGaN single layer structure is applied, if the lattice constant of the strain relief layer is made to approximate that of the active layer in order to increase the lattice matching effect, the bandgap energy of the strain relief layer may approximate that of the active layer. Accordingly, the strain relief layer may absorb light emitted from the active layer.

For instance, according to the related art, since the difference ($\Delta g1=Egs1-Egm$) between the bandgap energy (Egm) of the active layer and the bandgap energy (Egs1) of the strain relief layer is small, as the lattice constant of the strain relief layer approximates that of the active layer, the bandgap energy of the strain relief layer approximates the bandgap energy of the active layer so that the strain relief layer absorbs the light emitted from the active layer.

Meanwhile, according to the embodiment, the $Al_xIn_yGa_{1-x-y}N$ layer 122 may have a multi-layer structure. For instance, the $Al_xIn_yGa_{1-x-y}N$ layer 122 may include plural pairs of $Al_xIn_yGa_{1-x-y}N$ and GaN, but the embodiment is not limited thereto.

In addition, the $Al_xIn_yGa_{1-x-y}N$ layer 122 may be formed in the thickness of about 700 nm or less, but the embodiment is not limited thereto.

The $Al_xIn_yGa_{1-x-y}N$ layer 122 may have the lattice constant greater than that of the first conductive semiconductor layer 112, and may have the lattice constant smaller than that of the active layer 114.

Accordingly, the $Al_xIn_yGa_{1-x-y}N$ layer 122 may have the lattice constant greater than that of the first conductive semiconductor layer 112, and smaller than that of the active layer 114 to minimize the stress caused by the difference in the lattice constant between the active layer 114 and the first conductive semiconductor layer 112.

According to the embodiment, a bandgap energy level and a lattice constant of the $Al_xIn_yGa_{1-x-y}N$ layer 122 may vary independently from each other.

For instance, the $Al_xIn_yGa_{1-x-y}N$ layer 122 maintains a predetermined bandgap energy level or more and the lattice constant thereof independently varies.

In detail, bandgap energy (Egs2) of the $Al_xIn_yGa_{1-x-y}N$ layer 122 may be higher than bandgap energy (Egm) of the active layer 114 by about 120 meV or more.

Therefore, the difference ($\Delta Eg2=Egs2-Egm$) between the bandgap energy (Egm) of the active layer and the bandgap energy (Egs2) of the $Al_xIn_yGa_{1-x-y}N$ layer is maintained to predetermined bandgap energy level or more and the lattice constant independently varies.

Accordingly, even if the lattice constant of the $Al_xIn_yGa_{1-x-y}N$ layer 122 approximates that of the active layer, the difference in bandgap energy between the active layer and the $Al_xIn_yGa_{1-x-y}N$ layer 122 may be maintained to the predetermined bandgap energy level of about 120 meV or more and the lattice constant may independently vary.

The embodiment can provide the light emitting device 100, in which the difference in bandgap energy between the active layer 114 and the $Al_xIn_yGa_{1-x-y}N$ layer 122 is maintained to a predetermined level or more to minimize the absorption of the emitted light in the $Al_xIn_yGa_{1-x-y}N$ layer 122, thereby enhancing the light efficiency, and the lattice constants of the active layer 114 and the $Al_xIn_yGa_{1-x-y}N$ layer 122 approximate each other to maximize the strain relief according to the lattice matching therebetween, thereby enhancing the increase of the light efficiency, and a method of fabricating the light emitting device 100, a light emitting device package, and a lighting system.

In addition, according to the related art, as illustrated in FIG. 3, when the strain relief layer has the InGaN/GaN structure, the difference in the bandgap energy between InGaN and GaN is greatly represented in the strain relief layer, so that the bandgap energy of the strain relief layer is difficult to maintain the difference from the bandgap energy of the active layer 114 to a predetermined level or more.

Meanwhile, according to the embodiment, as illustrated in FIG. 4, when the $Al_xIn_yGa_{1-x-y}N$ layer 122 includes $Al_xIn_yGa_{1-x-y}N$/GaN, the difference in bandgap energy between $Al_xIn_yGa_{1-x-y}N$ and GaN is small in the $Al_xIn_yGa_{1-x-y}N$ layer 122, so that the bandgap energy of the $Al_xIn_yGa_{1-x-y}N$ layer 122 may be maintained to a great value. Accordingly, the difference in the bandgap energy between the active layer 114 and the $Al_xIn_yGa_{1-x-y}N$ layer 122 can be maintained to a predetermined level or more.

Figure 5:
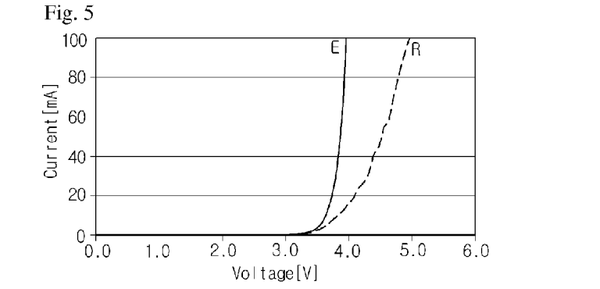
FIG. 5 is a graph illustrating a current-voltage (I-V) characteristic in the light emitting device according to the embodiment.

FIG. 5 is a graph illustrating a current-voltage (I-V) characteristic in the light emitting device 100 according to the embodiment.

Although the thickness of the strain relief layer may be increased in order to sufficiently relieve the strain within the limited range according to the related art, operating voltage Vf of the light emitting device may be increased due to the voltage loss in the strain relief layer.

The embodiment can provide the light emitting device including the $Al_xIn_yGa_{1-x-y}N$ layer 122, which is capable of maintaining the bandgap energy difference from the active layer to a predetermined level or more with the independently-varying lattice constant, thereby reducing the band discontinuity between the active layer and the $Al_xIn_yGa_{1-x-y}N$ layer 122 to minimize voltage loss and current loss in the $Al_xIn_yGa_{1-x-y}N$ layer 122, so that the operating voltage Vf (R) of the embodiment can be more reduced when comparing with that (R) of the related art, the method of fabricating the light emitting device, a light emitting device package, and a lighting system.

The embodiment can provide the light emitting device capable of minimizing the absorption of the emitted light in the $Al_xIn_yGa_{1-x-y}N$ layer 122 to enhance the light efficiency, the method of fabricating the light emitting device, a light emitting device package, and a lighting system.

In addition, the embodiment can provide the light emitting device capable of reducing the band discontinuity between the active layer and the $Al_xIn_yGa_{1-x-y}N$ layer when the $Al_xIn_yGa_{1-x-y}N$ layer is provided under the active layer, so that the voltage loss is minimized in the $Al_xIn_yGa_{1-x-y}N$ layer to reduce the operating voltage Vf, a method of fabricating the light emitting device, a light emitting device package, and a lighting system.

Hereinafter, the method of fabricating the light emitting device according to the embodiment will be described with reference to FIGS. 6 to 8.

Figure 6:
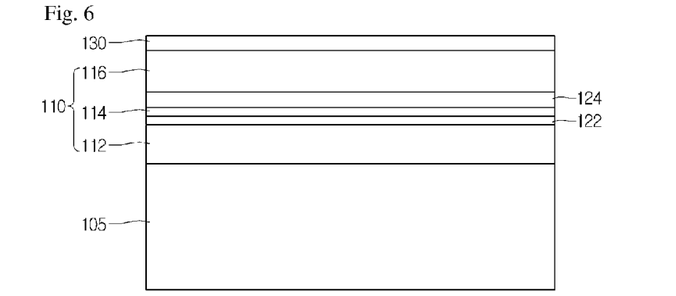
FIGS. 6 to 8 are sectional views illustrating a method of fabricating the light emitting device according to the embodiment.

First, as illustrated in FIG. 6, a substrate 105 can be prepared, The substrate 105 may include a material representing superior thermal conductivity. The substrate 105 may include a conductive substrate or an insulating substrate. For instance, the substrate 105 may include at least one of sapphire ($Al_2O_3$), SiC, Si, GaAs, GaN, ZnO, GaP, InP, Ge, and $Ga_2O_3$. The substrate 105 is provided thereon with a concave-convex structure, but the embodiment is not limited thereto.

The foreign matters may be removed from the surface of the first substrate 105 by performing wet-cleaning with respect to the first substrate 105.

Thereafter, the first substrate 105 may be provided thereon with a light emitting structure 110 including the first conductive semiconductor layer 112, the active layer 114, and the second conductive semiconductor layer 116.

The substrate 105 may be provided thereon with a buffer layer (not illustrated). The buffer layer may reduce the lattice mismatching between the material constituting the light emitting structure 110 and the substrate 105. The buffer layer may include a group III-V compound semiconductor. For instance, the buffer layer may include at least one of GaN, InN, AlN, InGaN, AlGaN, InAlGaN, and AlInN.

According to the embodiment, the buffer layer may include first and second buffer layers formed on the substrate 105.

For instance, the first buffer layer may include an undoped gallium nitride layer. The second buffer layer may include a superlattice layer including $Al_xGa_{(1-x)}N$ ($0 \leq x \leq 1$)/GaN. The $Al_xGa_{(1-x)}N$ ($0 \leq x \leq 1$/GaN superlattice layer serving as the second buffer layer may more effectively prevent the dislocations resulting from the lattice mismatching between the material constituting the light emitting structure and the substrate 105.

The first conductive semiconductor layer 112 may include a semiconductor compound. The first conductive semiconductor layer 112 may be realized by using a group III-V compound semiconductor or a group II-IV compound semiconductor. The first conductive semiconductor layer 112 may be doped with first conductive type dopants. If the first conductive semiconductor layer 112 is an N type semiconductor layer, the first conductive dopants include N type dopants such as Si, Ge, Sn, Se, and Te, but the embodiment is not limited thereto.

The first conductive semiconductor layer 112 may include a semiconductor material having the compositional formula of $In_xAl_yGa_{1-x-y}N$ ($0 \leq x \leq 1$, and $0 \leq x+y \leq 1$).

The first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 112 may include an N type GaN layer formed through a chemical deposition vapor (CVD) scheme, a molecular beam epitaxy (MBE) scheme, a sputtering scheme, or a hydride vapor phase epitaxy (HVPE) scheme. In addition, the first conductive semiconductor layer 112 may be formed by introducing trimethyl gallium gas (TMGa), ammonia gas ($NH_3$), nitrogen gas ($N_2$), and silane gas ($SiH_4$) including N type dopants such as silicon (Si) into a chamber.

Next, the first conductive semiconductor layer 112 is provided thereon with a current spreading layer (not illustrated) so that the light efficiency can be enhanced. The current spreading layer may include an undoped GaN layer, but the embodiment is not limited thereto.

Subsequently, according to the embodiment, the current spreading layer is provided thereon with an electron injection layer (not illustrated) so that light efficiency can be enhanced. The electron injection layer may include a first conductive gallium nitride layer. For instance, the electron injection layer is doped with N type dopants at the concentration of $6.0 \times 10^{18}$ atoms/$cm^3$ to $8.0 \times 10^{18}$ atoms/$cm^3$ so that the electrons can be effectively injected.

In addition, according to the embodiment, the $Al_xIn_yGa_{1-x-y}N$ layer 122 ($0<x \leq 1$ and $0<y \leq 1$) may be formed on the first conductive semiconductor layer 112.

According to the embodiment, the $Al_xIn_yGa_{1-x-y}N$ layer 122 may have a multi-layer structure. For instance, the $Al_xIn_yGa_{1-x-y}N$ layer 122 may include plural pairs of $Al_xIn_yGa_{1-x-y}N$ and GaN, but the embodiment is not limited thereto.

In addition, according to the embodiment, the $Al_xIn_yGa_{1-x-y}N$ layer 122 may include $Al_xIn_yGa_{1-x-y}N$ ($0<x \leq 1$ and $0<y \leq 1$)/$Al_pIn_qGa_{1-p-q}N$ ($0 \leq p \leq 1$ and $0 \leq q \leq 1$).

The $Al_xIn_yGa_{1-x-y}N$ layer 122 may have the lattice constant greater than that of the first conductive semiconductor layer 112, and smaller than that of the active layer 114. Accordingly, the stress caused by the difference in lattice constant between the active layer 114 and the first conductive semiconductor layer 112 can be minimized.

According to the embodiment, a bandgap energy level and a lattice constant of the $Al_xIn_yGa_{1-x-y}N$ layer 122 may vary independently from each other.

For instance, the $Al_xIn_yGa_{1-x-y}N$ layer 122 maintains a predetermined bandgap energy level or more and the lattice constant thereof independently varies.

In detail, the bandgap energy (Egs2) of the $Al_xIn_yGa_{1-x-y}N$ layer 122 may be higher than the bandgap energy (Egm) of the active layer 114 by about 120 meV or more. Therefore, the difference ($\Delta Eg2=Egs2-Egm$) between the bandgap energy (Egm) of the active layer and the bandgap energy (Egs2) of the $Al_xIn_yGa_{1-x-y}N$ layer is maintained to a predetermined bandgap energy level or more and the lattice constant of the $Al_xIn_yGa_{1-x-y}N$ layer independently varies.

Accordingly, even if the lattice constant of the $Al_xIn_yGa_{1-x-y}N$ layer 122 approximates that of the active layer, the difference in bandgap energy between the active layer and the $Al_xIn_yGa_{1-x-y}N$ layer 122 may be maintained to the predetermined bandgap energy level or more and the lattice constant of the $Al_xIn_yGa_{1-x-y}N$ layer 122 may independently vary.

The embodiment can provide the light emitting device, in which the difference in bandgap energy between the active layer 114 and the $Al_xIn_yGa_{1-x-y}N$ layer 122 is maintained to the predetermined level or more to minimize the absorption of the emitted light in the $Al_xIn_yGa_{1-x-y}N$ layer 122, thereby enhancing the light efficiency, and the lattice constants of the active layer 114 and the $Al_xIn_yGa_{1-x-y}N$ layer 122 approximate each other to maximize the strain relief according to the lattice matching therebetween, thereby maximizing the enhancement of the light efficiency, and a method of fabricating the light emitting device 100, a light emitting device package, and a lighting system.

In addition, the embodiment can provide the light emitting device including the $Al_xIn_yGa_{1-x-y}N$ layer 122, which is capable of maintaining the bandgap energy difference from the active layer 114 to the predetermined level or more with the independently-varying lattice constant to reduce the band discontinuity between the active layer 114 and the $Al_xIn_yGa_{1-x-y}N$ layer 122, thereby minimizing voltage loss and current loss in the $Al_xIn_yGa_{1-x-y}N$ layer 122, so that the operating voltage Vf can be more reduced when comparing with that of the related art, the method of fabricating the light emitting device, a light emitting device package, and a lighting system.

Thereafter, the $Al_xIn_yGa_{1-x-y}N$ layer 122 is provided thereon with the active layer 114.

Electrons injected through the first conductive semiconductor layer 112 are combined with holes injected through the second conductive semiconductor layer 116 at the active layer 114, so the active layer 114 emits light having predetermined energy, which is determined according to an energy band of a material constituting the active layer 114 (light emitting layer).

The active layer 114 may include at least one of a single quantum well structure, a multiple quantum well (MQW) structure, a quantum-wire structure and a quantum dot structure. For instance, the active layer 114 may have the MQW structure formed by injecting TMGa gas, $NH_3$ gas, $N_2$ gas, and trimethyl indium (TMIn) gas, but the embodiment is not limited thereto.

The well layer/barrier layer of the active layer 114 may have a pair structure including at least one of InGaN/GaN, InGaN/InGaN, GaN/AlGaN, InAlGaN/GaN, GaAs(InGaAs)/AlGaAs, and GaP(InGaP)/AlGaP, but the embodiment is not limited thereto. The well layer may include a material having bandgap lower than that of the barrier layer.

Next, the active layer 114 may be provided thereon with an electron blocking layer 124.

According to the embodiment, the electron blocking layer 124 is formed on the active layer 114 to perform an electron blocking function and an MQW cladding function of the active layer 114, so that the light emission efficiency can be improved. For instance, the electron blocking layer 124 may include a semiconductor based on $Al_xIn_yGa_{(1-x-y)}N$ ($0 \leq x \leq 1$, $0 \leq y \leq 1$), and may have the energy bandgap higher than the energy bandgap of the active layer 114. The electron blocking layer 124 may have the thickness of about 100 Å to about 600 Å but the embodiment is not limited thereto.

In addition, the electron blocking layer 124 may include an $Al_zGa_{(1-z)}N/GaN$ ($0 \leq z \leq 1$) superlattice layer, but the embodiment is not limited thereto.

A p-type ion is implanted into the electron blocking layer 124 to efficiently block overflowed electrons and enhance injection efficiency of holes. An Mg ion is implanted into the electron blocking layer 124 at the concentration in the range of about $10^{18}/cm^3$ to about $10^{20}/cm^3$ to efficiently block overflowed electrons and enhance injection efficiency of holes.

The electron blocking layer 124 may effectively block electrons overflowed into a P type semiconductor layer without the recombination with holes in the active layer 114 and enhance the injection efficiency of holes. In addition, the electron blocking layer 124 may be doped with P type dopants or N type dopants. For instance, the electron blocking layer 124. Mg ions are implanted into the electron blocking layer 124 at the concentration in the range of about $10^{18}/cm^3$ to about $10^{20}/cm^3$ to efficiently block overflowed electrons and enhance injection efficiency of holes.

Next, the electron blocking layer 124 is provided thereon with the second conductive semiconductor layer 116.

The second conductive semiconductor layer 116 may include a semiconductor compound. The second conductive semiconductor layer 116 may be realized by using a group III-V compound semiconductor or a group II-IV compound semiconductor, and may be doped with second conductive type dopants.

For instance, the second conductive semiconductor layer 116 may include a semiconductor material having the compositional formula of $In_xAl_yGa_{1-x-y}N$ ($0 \leq x \leq 1$, $0 \leq y \leq 1$, and $0 \leq x+y \leq 1$). If the second conductive semiconductor layer 116 is a P type semiconductor layer, the second conductive dopants may include P type dopants such as Mg, Zn, Ca, Sr, and Ba.

The second conductive semiconductor layer 116 may include a P type GaN layer formed by introducing trimethyl gallium gas (TMGa), ammonia gas (NH3), nitrogen gas (N2), and bis-ethylcyclopentadienyl magnesium $(EtCp_2Mg)\{Mg(C_2H_5C_5H_4)_2$ including P type dopants such as magnesium (Mg) into a chamber.

According to the embodiment, the first conductive semiconductor layer 112 may include an N type semiconductor layer and the second conductive semiconductor layer 116 may include a P type semiconductor layer, but the embodiment is not limited thereto. In addition, a semiconductor layer, such as an N type semiconductor layer (not illustrated) having polarity opposite to that of the second conductive semiconductor layer 116, may be formed on the second conductive semiconductor layer 116.

Thus, the light emitting structure 110 may include one of an N-P junction structure, a P-N junction structure, an N-P-N junction structure, and a P-N-P junction structure.

Thereafter, the second conductive semiconductor layer 116 may be provided thereon with a transmissive ohmic layer 130. The transmissive ohmic layer 130 may be formed by laminating single metal, or by laminating a metal alloy and metal oxide in a multi-layer such that carrier injection may be efficiently performed. For instance, the transmissive ohmic layer 130 may include a material representing superior electrical connection with a semiconductor.

For instance, the transmissive ohmic layer 130 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

Figure 7:
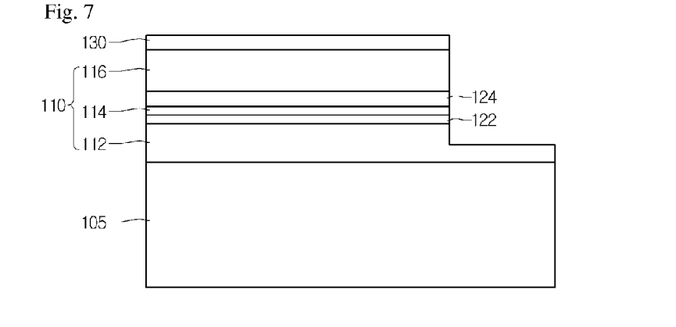

Next, as illustrated in FIG. 7, a mesa etching process may be performed so that a portion of the first conductive semiconductor layer 112 may be exposed. For instance, the portion of the first conductive semiconductor layer 112 may be exposed by removing portions of the transmissive ohmic layer 130, the second conductive semiconductor layer 116, the electron blocking layer 124, the active layer 114, and the $Al_xIn_yGa_{1-x-y}N$ ($0<x \leq 1$ and $0<y \leq 1$) layer 122.

Figure 8:
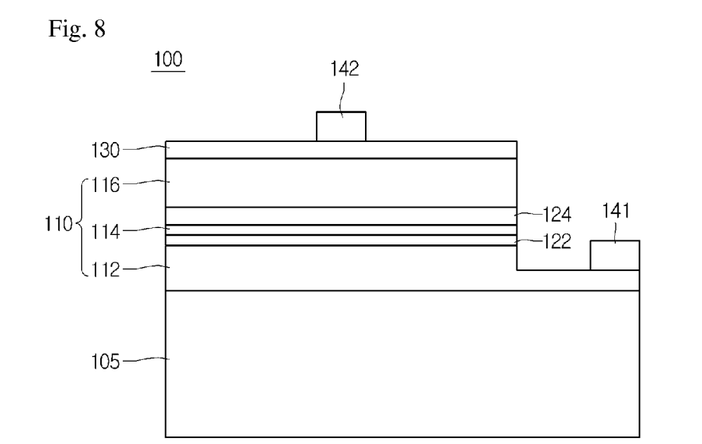

Thereafter, as illustrated in FIG. 8, a first electrode 141 may be formed on the exposed first conductive semiconductor layer 112, and a second electrode 142 may be formed on the transmissive ohmic layer 130.

The embodiment can provide the light emitting device capable of minimizing the absorption of the emitted light in the $Al_xIn_yGa_{1-x-y}N$ layer 122 to enhance the light efficiency, the method of fabricating the light emitting device, a light emitting device package, and a lighting system.

In addition, the embodiment can provide a light emitting device capable of reducing the band discontinuity between the active layer 114 and the $Al_xIn_yGa_{1-x-y}N$ layer 122 when the $Al_xIn_yGa_{1-x-y}N$ layer 122 is provided under the active layer, so that the voltage loss is minimized in the $Al_xIn_yGa_{1-x-y}N$ layer 122 to reduce the operating voltage Vf, a method of fabricating the light emitting device, a light emitting device package, and a lighting system.

Figure 9:
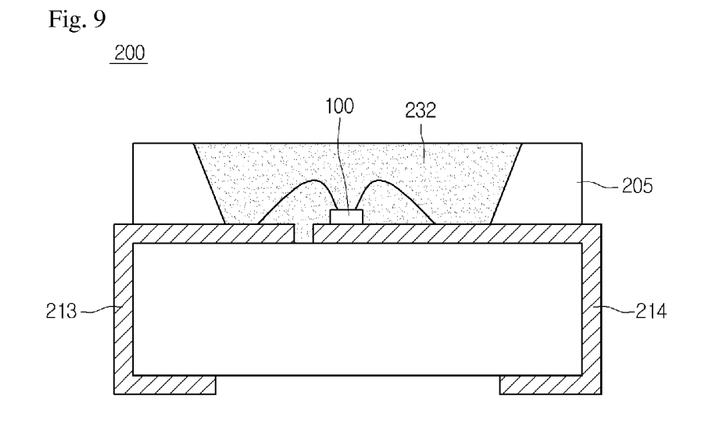
FIG. 9 is sectional view of a light emitting package according to the embodiment.

FIG. 9 is a view showing a light emitting device package 200 in which a light emitting device according to the embodiments is installed.

The light emitting device package 200 according to the embodiment includes a package body 205, third and second lead electrodes 213 and 214 formed on the package body 205, the light emitting device 100 according to the embodiment, which is installed in the package body 205 and electrically connected to the third and second lead electrodes 213 and 214, and a molding member 230 surrounding the light emitting device 100.

The package body 205 may include silicon, synthetic resin, or metallic material. An inclined surface may be formed around the light emitting device 100.

The third and fourth lead electrodes 213 and 214 are electrically insulated from each other and supply power to the light emitting device 100. The third and second lead electrodes 213 and 214 may reflect light emitted from the light emitting device 100 to increase light efficiency, and may dissipate heat generated from the light emitting device 100 to the outside.

The light emitting device 100 may include a lateral type light emitting device shown in FIG. 1, but the embodiment is not limited thereto. In addition, the light emitting device 100 may include a vertical type light emitting device.

The light emitting device 100 may be mounted on the package body 205 or on the third lead electrode 213 or the fourth lead electrode 214.

The light emitting device 100 may be electrically connected with the third lead electrode 213 and/or the fourth lead electrode 214 through one of a wire scheme, a flip chip scheme and a die bonding scheme. Although FIG. 5 shows that the light emitting device 100 is electrically connected with the third lead electrode 213 and the fourth lead electrode 214 through a wire, the embodiment is not limited thereto.

The molding member 230 may protect the light emitting device 100 by surrounding the light emitting device 100. In addition, the molding member 230 may include phosphors (232) to change the wavelength of light emitted from the light emitting device 100.

Figure 10:
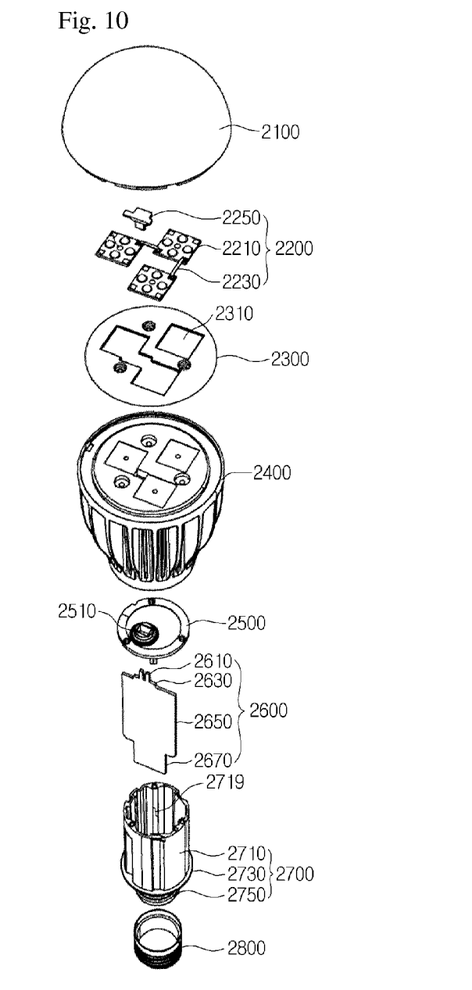
FIGS. 10 to 12 are exploded perspective views showing examples of a lighting system including a light emitting device according to the embodiment.
Figure 11:
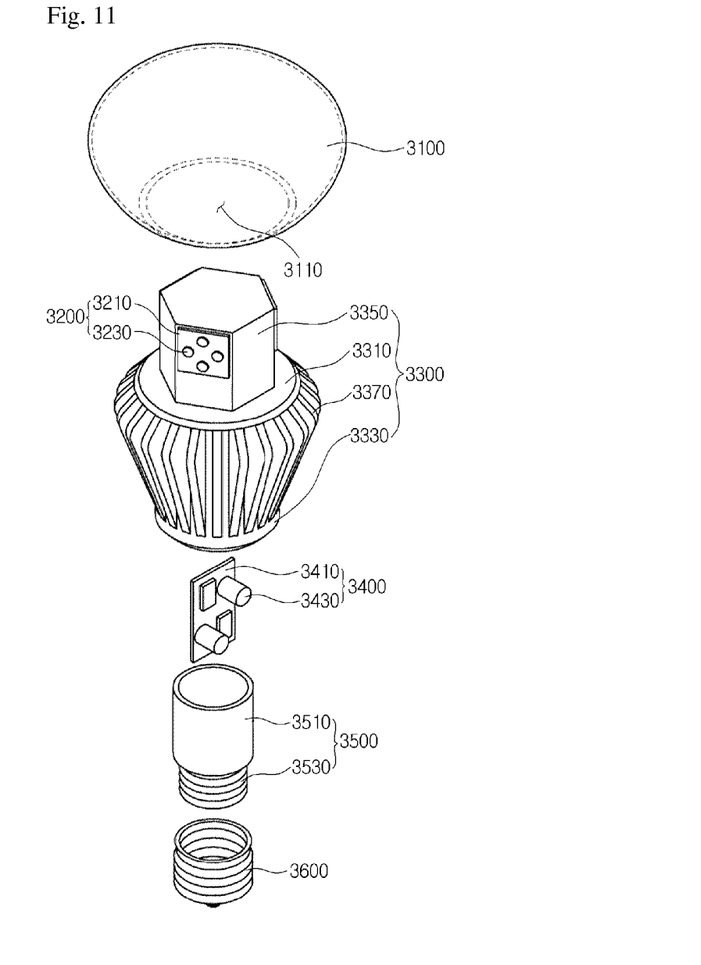
Figure 12:
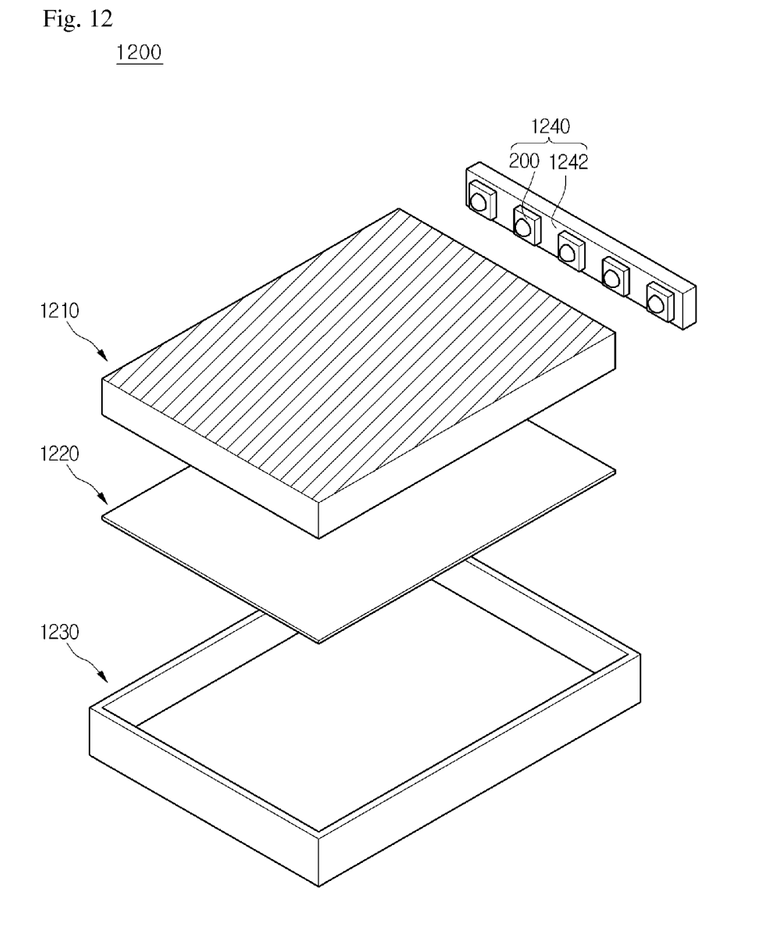

FIGS. 10 to 12 are exploded perspective views showing examples of a lighting system including a light emitting device according to the embodiment.

As shown in FIG. 10, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 3100 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a + electric wire and a − electric wire are electrically connected to the extension part 2670 and second terminals of the + electric wire and the − electric wire may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

As shown in FIG. 11, the lighting system according to the embodiment may include a cover 3100, a light source part 3200, a radiator 3300, a circuit part 3400, an inner case 3500, and a socket 3600. The light source part 3200 may include the light emitting device or the light emitting device module according to the embodiment.

The cover 3100 may have a blub shape and is hollow. The cover 3100 has an opening 3110. The light source part 3200 and a member 3350 may be inserted through the opening 3110.

The cover 3100 may be coupled with the radiator 3300, and may surround the light source part 3200 and the member 3350. The light source part 3200 and the member 3350 may be blocked from the outside by the coupling between the cover 3100 and the radiator 3300. The cover 3100 may be coupled with the radiator 3300 by an adhesive or various schemes such as a rotation coupling scheme and a hook coupling scheme. The rotation coupling scheme is a scheme where a thread of the cover 3100 is coupled with a screw groove of the radiator 3300, and the cover 3100 is coupled with the radiator 3300 by rotation of the cover 3100. The hook coupling scheme is a scheme where a projection of the cover 3100 is inserted into a groove of the radiator 3300 so that the cover 3100 is coupled with the radiator 3300.

The cover 3100 may be optically coupled with the light source part 3200. In detail, the cover 3100 may diffuse, scatter, or excite light provided from a light emitting device 3230 of the light source part 3200. The cover 3100 may be a type of optical member. The cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

For example, a material of the cover 3100 may include glass, plastic, polypropylene (PP), polyethylene (PE), and polycarbonate (PC). The polycarbonate (PC) has the superior light resistance, heat resistance and strength among the above materials. The cover 3100 may be transparent so that a user may view the light source module 2200 from the outside, or opaque. The cover 3100 may be formed through a blow molding scheme.

The light source part 3200 is disposed at the member 3350 of the radiator 3300, and a plurality of light source part may be disposed. In detail, the light source part 3200 may be disposed in at least one of a plurality of lateral sides of the member 3350. A top end of the light source part 3200 of the light source part 3200 may be disposed at the lateral side of the member 3350.

The light source part 3200 may be disposed at three of six lateral sides of the member 3350. However, the embodiment is not limited thereto, and the light source part 3200 may be disposed at all lateral sides of the member 3350. The light source part 3200 may include a substrate 3210 and a light emitting device 3230. The light emitting device 32030 may be disposed on one surface of the substrate 3210.

The substrate 3210 has a rectangular shape, but the embodiment is not limited thereto. The substrate 3210 may have various shapes. For example, the substrate 3210 may have a circular shape or a polygonal shape. The substrate 3210 may be provided by printing a circuit pattern on an insulator.

For example, the typical printed circuit board (PCB) may include a metal core PCB, a flexible PCB, and a ceramic PCB. In addition, the substrate may have a COB (chips on board) type in which LED chips, which are not packaged, are directly bonded on the PCB. In addition, the substrate 3210 may include a material to effectively reflect light, or the surface of the substrate may have a color such as a gold color or a silver color to effectively reflect the light. The substrate 3210 may be electrically connected to the circuit part 3400 received in the radiator 3300.

For example, the substrate 3210 and the circuit part 3400 may be connected to each other by a wire. The wire may connect the substrate 3210 and the circuit part 3400 to each other through the radiator 3300.

The light emitting device 3230 may include a light emitting diode chip to emit red, green, and blue lights or a light emitting diode chip to emit UV. The light emitting diode may have the lateral type or the vertical type. The light emitting diode may emit one of blue, red, yellow, and green lights.

The light emitting device 3230 may include a luminescence material. The luminescence material may include at least one of garnet-based phosphors (YAG, or TAG), silicate-based phosphors, nitride-based phosphors, and oxynitride-based phosphors. The luminescence material may include at least one of a red luminescence material, a yellow luminescence material and a green luminescence material.

The radiator 3300 is coupled with the cover 3100, and may radiate heat from the light source part 3200. The radiator 330 has a predetermined volume, and includes a top surface 3310 and a lateral side 3330. The member 3350 may be disposed on the top surface 3310 of the radiator 3310. The top surface 3310 of the radiator 3300 may be coupled with the cover 3100. The top surface of the radiator 3300 may have a shape corresponding to an opening 3110 of the cover 3100.

A plurality of heat radiation pins 3370 may be disposed at the lateral side 3330 of the radiator 3300. The heat radiation pin 3370 may extend outward from the lateral side of the radiator 3300 or may be connected to the lateral side of the radiator 3300. The heat radiation pin 3370 may improve heat radiation efficiency by increasing a heat radiation area of the radiator 3300. The lateral side 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six lateral sides. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at six lateral sides of the member 3350. The light source part 3200 may be disposed at all or some of the six lateral sides of the member 3350. The light source part 3200 is disposed at three of the six lateral sides of the member 3350 in FIG. 11.

The substrate 3210 is disposed at the lateral side of the member 3350. The lateral side of the member 3350 may be substantially vertical to the top surface of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), or tin (Sn). The member 3350 may include a plastic material having thermal conductivity. The plastic material having thermal conductivity is lighter than the metal and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and may be received in the radiator 3300 together with the inner case 3500. The circuit part 3400 may include a circuit board 3410 and a plurality of components mounted on the circuit board 3410.

The circuit board 3410 has a circular shape, but the embodiment is not limited thereto. That is, the circuit board 3410 may have various shapes. For example, the circuit board may have an elliptical shape or a polygonal shape. The circuit board 3410 may be provided by printing a circuit pattern on an insulator.

The circuit board 3410 is electrically connected to the substrate 3210 of the light source part 3200. For example, the circuit part 3410 and the substrate 3210 may be connected to each other by a wire. The wire may be disposed inside the radiator 3300 to connect the substrate 3210 with the circuit board 3410.

For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be changed according to the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled with the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled with the inner case 3500. In detail, the socket 3600 may be coupled with the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. If external power is applied to the socket 3600, the external power may be transferred to the circuit part 3400. The socket 360 may have a screw groove structure corresponding to a thread structure of the connecting part 3550.

Further, as shown in FIG. 12, the lighting system according to the embodiment, for example, a backlight unit includes a light guide plate 1210, a light emitting module 1240 for providing the light to the light guide plate 1210, a reflective member 1220 positioned below the light guide plate 1210, and a bottom cover 1230 for receiving the light guide plate 1210, the light emitting module 1240, and the reflective member 1220 therein, but the embodiment is not limited thereto.

The light guide plate 1210 diffuses the light to provide surface light. The light guide plate 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB) as well as a typical PCB, but the embodiment is not limited thereto.

In addition, the light emitting device packages 200 are arranged on the substrate 1242 such that light exit surfaces of the light emitting device packages 200 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

As described above, the embodiment can provide the light emitting device capable of increasing light efficiency by minimizing the absorption of the emitted light in the strain relief layer, the method of fabricating the light emitting device, the light emitting device package, and the lighting system.

In addition, the embodiment can provide a light emitting device capable of minimizing voltage loss in the strain relief layer by reducing the band discontinuity between the strain relieve layer and the active layer when the strain relief layer is provided under the active layer, so that the operating voltage can be lowered, the method of fabricating the light emitting device, the light emitting device package, and the lighting system.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A plurality of light emitting device packages according to the embodiment may be arrayed on the substrate and the light guide plate, the prism sheet, the diffusion sheet and the fluorescent sheet serving as optical members may be disposed on a path of light emitted from the light emitting device packages. The light emitting packages, the substrate, and the optical member may serve as the backlight unit or a lighting unit. For example, the lighting system may include the backlight unit, the lighting unit, an indicator, a lamp, or a street lamp.

The invention claimed is:

1. A light emitting device comprising:
a first conductive semiconductor layer;
an $Al_xIn_yGa_{1-x-y}N$ layer ($0<x\le1$ and $0<y\le1$) on the first conductive semiconductor layer;
an active layer on the $Al_xIn_yGa_{1-x-y}N$ layer; and
a second conductive semiconductor layer on the active layer,
wherein the $Al_xIn_yGa_{1-x-y}N$ layer has a lattice constant greater than a lattice constant of the first conductive semiconductor layer, and
wherein bandgap energy of the $Al_xIn_yGa_{1-x-y}N$ layer is higher than bandgap energy of the active layer by 120 meV or more.

2. The light emitting device of claim 1, wherein a plurality of $Al_xIn_yGa_{1-x-y}N$ layers are provided.

3. The light emitting device of claim 2, wherein each $Al_xIn_yGa_{1-x-y}N$ layer includes $Al_xIn_yGa_{1-x-y}N$ and GaN.

4. The light emitting device of claim 3, wherein each $Al_xIn_yGa_{1-x-y}N$ layer includes plural pairs of $Al_xIn_yGa_{1-x-y}N$ and GaN.

5. The light emitting device of claim 1, wherein the $Al_xIn_yGa_{1-x-y}N$ layer is formed in a thickness of 700 nm or less.

6. The light emitting device of claim 1, wherein the $Al_xIn_yGa_{1-x-y}N$ layer has a lattice constant smaller than a lattice constant of the active layer.

7. The light emitting device of claim 1, wherein the $Al_xIn_yGa_{1-x-y}N$ layer has a lattice constant greater than a lattice constant of the first conductive semiconductor layer and smaller than a lattice constant of the active layer.

8. The light emitting device of claim 1, wherein the $Al_xIn_yGa_{1-x-y}N$ layer includes $Al_xIn_yGa_{1-x-y}N$ ($0<x\le1$ and $0<y\le1$)/$Al_pIn_qGa_{1-p-q}N$ ($0\le q\le1$).

9. A light emitting device comprising:
a first conductive semiconductor layer;
an $Al_xIn_yGa_{1-x-y}N$ layer ($0<x\le1$ and $0<y\le1$) on the first conductive semiconductor layer;
an active layer on the $Al_xIn_yGa_{1-x-y}N$ layer; and
a second conductive semiconductor layer on the active layer,
wherein bandgap energy of the $Al_xIn_yGa_{1-x-y}N$ layer is higher than bandgap energy of the active layer by 120 meV or more, and
wherein the $Al_xIn_yGa_{1-x-y}N$ layer has bandgap energy and a lattice constant that vary independently from each other.

10. The light emitting device of claim 9, wherein the $Al_xIn_yGa_{1-x-y}N$ maintains a predetermined bandgap energy level or more and the lattice constant thereof independently varies.

11. The light emitting device of claim 9, wherein a difference in bandgap energy between the active layer and the $Al_xIn_yGa_{1-x-y}N$ layer is maintained to the predetermined bandgap energy level or more and the lattice constant independently varies.

12. The light emitting device of claim 9, wherein the $Al_xIn_yGa_{1-x-y}N$ maintains the bandgap energy higher than bandgap energy of the active layer by 120 mV or more and the lattice constant independently varies.

13. The light emitting device of claim 9, wherein a difference in bandgap energy between the active layer and the $Al_xIn_yGa_{1-x-y}N$ layer is maintained to the predetermined bandgap energy level or more and lattice constants of the $Al_xIn_yGa_{1-x-y}N$ layer and the active layer independently vary independent from the difference in band gap energy.

14. A light emitting device comprising:
a first conductive semiconductor layer;
an $Al_xIn_yGa_{1-x-y}N$ layer ($0<x\le1$ and $0<y\le1$) on the first conductive semiconductor layer;
an active layer on the $Al_xIn_yGa_{1-x-y}N$ layer; and
a second conductive semiconductor layer on the active layer,
wherein the $Al_xIn_yGa_{1-x-y}N$ layer has bandgap energy and a lattice constant that vary independently from each other.

15. The light emitting device of claim 14, wherein the $Al_xIn_yGa_{1-x-y}N$ maintains a predetermined bandgap energy level or more and the lattice constant thereof independently varies.

16. The light emitting device of claim 14, wherein a difference in bandgap energy between the active layer and the $Al_xIn_yGa_{1-x-y}N$ layer is maintained to the predetermined bandgap energy level or more and the lattice constant independently varies.

17. The light emitting device of claim 14, wherein bandgap energy of the $Al_xIn_yGa_{1-x-y}N$ layer is higher than bandgap energy of the active layer by 120 meV or more and the lattice constant independently varies.

18. The light emitting device of claim 17, wherein a difference in bandgap energy between the active layer and the $Al_xIn_yGa_{1-x-y}N$ layer is maintained to the predetermined bandgap energy level or more and lattice constants of the $Al_xIn_yGa_{1-x-y}N$ layer and the active layer independently vary independent from the difference in band gap energy.

19. The light emitting device of claim 14, wherein the $Al_xIn_yGa_{1-x-y}N$ layer has a lattice constant greater than a lattice constant of the first conductive semiconductor layer and smaller than a lattice constant of the active layer.

20. The light emitting device of claim 14, wherein the $Al_xIn_yGa_{1-x-y}N$ layer has a lattice constant greater than a lattice constant of the first conductive semiconductor layer.

* * * * *